US012763743B2

United States Patent
Sugimoto et al.

(12) United States Patent
(10) Patent No.: US 12,763,743 B2
(45) Date of Patent: Oct. 13, 2026

(54) VARIABLE GAIN AMPLIFIER CIRCUIT

(71) Applicant: SUMITOMO ELECTRIC INDUSTRIES, LTD., Osaka (JP)

(72) Inventors: Yoshiyuki Sugimoto, Osaka (JP); Keiji Tanaka, Osaka (JP); Hiroshi Uemura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 358 days.

(21) Appl. No.: 18/433,906

(22) Filed: Feb. 6, 2024

(65) Prior Publication Data

US 2024/0275350 A1 Aug. 15, 2024

(30) Foreign Application Priority Data

Feb. 9, 2023 (JP) ................................ 2023-018689

(51) Int. Cl.
*H03F 3/45* (2006.01)
*H03G 3/30* (2006.01)
*H03G 1/00* (2006.01)

(52) U.S. Cl.
CPC ........... *H03G 3/30* (2013.01); *H03F 3/45282* (2013.01); *H03G 1/0023* (2013.01); *H03G 2201/103* (2013.01)

(58) Field of Classification Search
CPC .. H03G 3/30; H03G 2201/103; H03G 1/0017; H03G 1/0023; H03G 1/0088; H03G 3/45098; H03G 1/0035; H03G 3/00; H03G 2201/10; H03F 3/45282; H03F 3/45089; H03F 3/45183; H03F 3/45
See application file for complete search history.

(56) References Cited

U.S. PATENT DOCUMENTS

| | | | | |
|---|---|---|---|---|
| 6,169,452 B1 * | 1/2001 | Popescu | H03G 1/0023 330/254 |
| 9,608,581 B2 * | 3/2017 | Itabashi | H03G 1/0023 |
| 10,263,583 B2 * | 4/2019 | Itabashi | H03F 3/45475 |
| 2012/0326782 A1 | 12/2012 | Sano et al. | |

FOREIGN PATENT DOCUMENTS

| | | |
|---|---|---|
| JP | S53-110352 | 9/1978 |
| JP | H10-224162 | 8/1998 |
| JP | H11-041044 | 2/1999 |
| JP | 2013-005372 | 1/2013 |
| JP | 2015-207923 | 11/2015 |

* cited by examiner

*Primary Examiner* — Khanh V Nguyen
(74) *Attorney, Agent, or Firm* — IPUSA, PLLC

(57) ABSTRACT

A variable gain amplifier circuit includes a main circuit including a differential current circuit, a current divider circuit connected to a high potential side of the differential current circuit, and a load circuit connected to a high potential side of the current divider circuit, the main circuit being configured to generate differential output voltage signals by the load circuit in accordance with either differential input voltage signals or first differential current signals; and a gain adjustment circuit configured to adjust a gain of the main circuit. The gain adjustment circuit includes a generation circuit configured to generate a first control voltage and a second control voltage in accordance with a setting signal, and a limit circuit configured to limit, by detecting an amplitude of the differential output voltage signals, the voltage difference to a limit value or greater so that the amplitude does not become lower than a setting voltage.

7 Claims, 5 Drawing Sheets

VARIABLE GAIN AMPLIFIER CIRCUIT

CROSS-REFERENCE TO RELATED APPLICATIONS

This patent application is based on and claims priority to Japanese Patent Application No. 2023-018689 filed on Feb. 9, 2023, the entire contents of which are incorporated herein by reference.

TECHNICAL FIELD

The present disclosure relates to a variable gain amplifier circuit.

BACKGROUND

A circuit using a Gilbert cell circuit is known as a variable gain amplifier circuit (for example, see Japanese Laid-open Patent Application Publication No. H10-224162).

SUMMARY

According to one aspect of the present disclosure, a variable gain amplifier circuit includes a main circuit including a differential current circuit, a current divider circuit connected to a high potential side of the differential current circuit, and a load circuit connected to a high potential side of the current divider circuit, the main circuit being configured to generate differential output voltage signals by the load circuit in accordance with either differential input voltage signals or first differential current signals input to the differential current circuit; and a gain adjustment circuit configured to adjust a gain of the main circuit. The differential current circuit generates second differential current signals in accordance with either the differential input voltage signals or the first differential current signals. The current divider circuit generates non-inverted divided signals and inverted divided signals from the second differential current signals in accordance with a voltage difference between a first control voltage and a second control voltage, the non-inverted divided signals having a same phase as the second differential current signals, and the inverted divided signals having an opposite phase that is opposite to the second differential current signals, and generates third differential current signals by respectively adding the non-inverted divided signals and the inverted divided signals. The load circuit converts the third differential current signals into the differential output voltage signals. The gain adjustment circuit includes a generation circuit configured to generate the first control voltage and the second control voltage in accordance with a setting signal, and a limit circuit configured to limit, by detecting an amplitude of the differential output voltage signals, the voltage difference to a limit value or greater so that the amplitude does not become lower than a setting voltage.

DETAILED DESCRIPTION OF EMBODIMENTS

Figure 1:
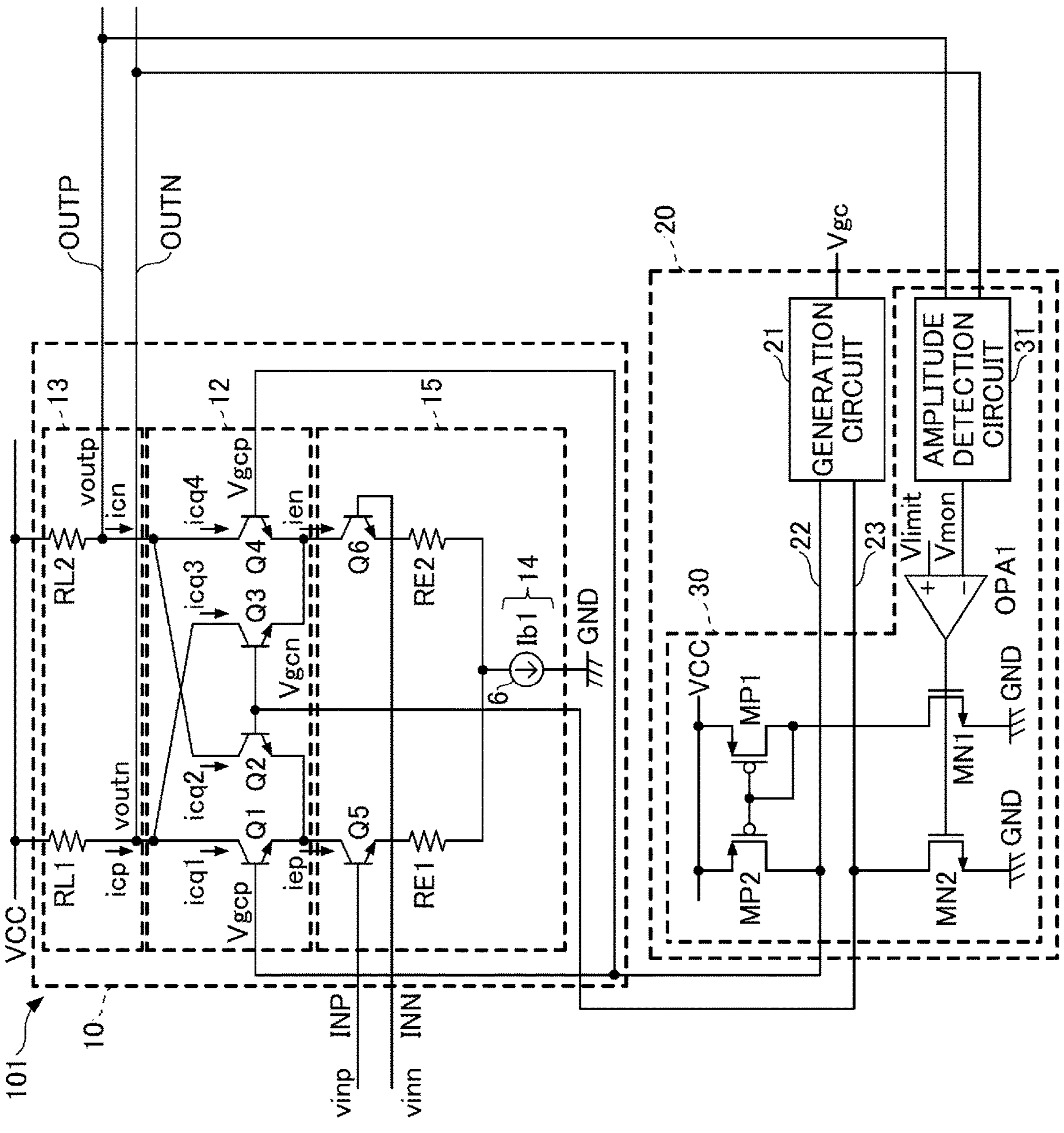
FIG. 1 is a diagram illustrating a configuration example of a variable gain amplifier circuit according to a first embodiment.

Problem to be Solved by the Present Disclosure

Because a change of an operating point of the Gilbert cell circuit performing four quadrant operation is small, a change in the frequency characteristic when the gain is changed is suppressed. However, when the gain is adjusted by a four quadrant Gilbert cell type variable gain amplifier, the output phase may be inverted.

Effects of the Invention

According to the present disclosure, inversion of the output phase when the gain is changed can be prevented.

Description of Embodiments of the Present Disclosure

First, embodiments of the present disclosure will be listed and described.

(1) A variable gain amplifier circuit of the present disclosure includes:

- a main circuit including a differential current circuit, a current divider circuit connected to a high potential side of the differential current circuit, and a load circuit connected to a high potential side of the current divider circuit, the main circuit being configured to generate differential output voltage signals by the load circuit in accordance with either differential input voltage signals or first differential current signals input to the differential current circuit; and
- a gain adjustment circuit configured to adjust a gain of the main circuit. The differential current circuit generates second differential current signals in accordance with either the differential input voltage signals or the first differential current signals. The current divider circuit generates non-inverted divided signals and inverted divided signals from the second differential current signals in accordance with a voltage difference between a first control voltage and a second control voltage, the non-inverted divided signals having a same phase as the second differential current signals, and the inverted divided signals having an opposite phase that is opposite to the second differential current signals, and generates third differential current signals by respectively adding the non-inverted divided signals and the inverted divided signals. The load circuit converts the third differential current signals into the differential output voltage signals. The gain adjustment circuit includes a generation circuit configured to generate the first control voltage and the second control voltage in accordance with a setting signal, and a limit circuit configured to limit, by detecting an amplitude of the differential output voltage signals, the voltage difference to a limit value or greater so that the amplitude does not become lower than a setting voltage.

According to (1), the voltage difference between the first control voltage and the second control voltage is limited to be greater than or equal to the limit value so that the amplitude of the differential output voltage signals does not become lower than the setting voltage. With this, when the setting signal input to the generation circuit changes such that the voltage difference becomes less than the limit value, the voltage difference can be prevented from becoming less than the limit value. Because the voltage difference is prevented from becoming less than the limit value, the phase of the differential output voltage signals can be prevented from being inverted by 180 degrees with respect to the phase of either the differential input voltage signals or the first differential current signals.

(2) In the above (1), the limit circuit may maintain the voltage difference at the limit value when the amplitude becomes equal to the setting voltage.

According to (2), when the amplitude becomes equal to the setting voltage, the voltage difference is maintained at the limit value, so that the voltage difference can be prevented from becoming less than the limit value. Because the voltage difference is prevented from becoming less than the limit value, the phase of the differential output voltage signals can be prevented from being inverted by 180 degrees with respect to the phase of either the differential input voltage signals or the first differential current signals.

(3) In the above (2), the limit circuit may include a first field-effect transistor (FET) and a second FET, and may turn on the first FET and the second FET when the amplitude becomes lower than the setting voltage. A drain of the first FET is connected to a first signal line for transmitting the first control voltage, a source of the first FET is connected to a power supply line, a drain of the second FET is connected to a second signal line for transmitting the second control voltage, and a source of the second FET is connected to a ground.

According to (3), when the amplitude becomes lower than the setting voltage, the limit circuit turns on the first FET and the second FET regardless of a value of the setting signal. When the first FET and the second FET are turned on, the first control voltage increases and the second control voltage decreases, so that the voltage difference can be prevented from becoming less than the limit value. Because the voltage difference is prevented from becoming less than the limit value, the phase of the differential output voltage signals can be prevented from being inverted by 180 degrees with respect to the phase of either the differential input voltage signals or the first differential current signals.

(4) In the above (3), the limit circuit may include:

- a detection circuit configured to output a monitor signal in accordance with the amplitude; and
- an operational amplifier configured to turn on the first FET and the second FET when a voltage value of the monitor signal becomes less than or equal to a setting value corresponding to the setting voltage.

According to (4), when the voltage value of the monitor signal becomes lower than a setting value corresponding to the setting voltage, the first FET and the second FET are turned on. With this, the first control voltage increases and the second control voltage decreases, so that the voltage difference can be prevented from becoming less than the limit value. Because the voltage difference is prevented from becoming less than the limit value, the phase of the differential output voltage signals can be prevented from being inverted by 180 degrees with respect to the phase of either the differential input voltage signals or the first differential current signals.

(5) In any one of the above (1) to (4), the differential current circuit may include a differential pair including a pair of transistors, and a constant current circuit connected between the differential pair and a ground line, and configured to supply a constant current to the differential pair. The differential pair may generate the second differential current signals in accordance with the differential input voltage signals. A sum of a positive-phase component and a negative-phase component of the second differential current signals may be equal to a magnitude of the constant current.

According to (5), the phase inversion of the differential output voltage signal is prevented during the change of the gain when the differential input voltage signals are amplified to the differential output voltage signals.

(6) In any one of (1) to (4), the differential current circuit may include a first constant current source configured to supply a first constant current and a second constant current source configured to supply a second constant current, a positive-phase component of the second differential current signals may be generated by subtracting a negative-phase component of the first differential current signals from the first constant current, a negative-phase component of the second differential current signals may be generated by subtracting a positive-phase component of the first differential current signals from the second constant current, and the second constant current may have a current value equal to a current value of the first constant current.

According to (6), the phase inversion of the differential output voltage signals is prevented during the change of the gain when the differential input current signals are amplified to the differential output voltage signals.

(7) A variable gain amplifier circuit includes:

- a differential current circuit configured to generate second differential current signals in accordance with either differential input voltage signals or first differential current signals;
- a current divider circuit configured to generate non-inverted divided signals and inverted divided signals from the second differential current signals in accordance with a voltage difference between a first control voltage and a second control voltage, the non-inverted divided signals having a same phase as the second differential current signals, and the inverted divided signals having an opposite phase that is opposite to the second differential current signals, and generate third differential current signals by respectively adding the non-inverted divided signals and the inverted divided signals;
- a load circuit configured to convert the third differential current signals into differential output voltage signals;
- a generation circuit configured to generate the first control voltage and the second control voltage in accordance with a setting signal; and
- a limit circuit configured to limit, by detecting an amplitude of the differential output voltage signal, the voltage difference to a limit value or greater so that the amplitude does not become lower than a setting voltage.

According to (7), the voltage difference between the first control voltage and the second control voltage is limited to the limit value or greater so that the amplitude of the differential output voltage signals does not become lower than the setting voltage. With this, when the setting signal input to the generation circuit is changed such that the voltage difference becomes less than the limit value, the voltage difference can be prevented from becoming less than the limit value. Because the voltage difference is prevented from becoming less than the limit value, the phase of the differential output voltage signals can be prevented from being inverted by 180 degrees with respect to the phase of either the differential input voltage signals or the first differential current signals.

Details of Embodiments of the Present Disclosure

Specific examples of the variable gain amplifier circuit of the present disclosure will be described below with reference to the drawings. Here, the present invention is not limited to these examples, but is defined by the claims, and it is intended to include all modifications within the scope of the claims and in the meaning equivalent to the claims.

FIG. 1 is a diagram illustrating a configuration example of a variable gain amplifier circuit according to a first embodiment. A variable gain amplifier circuit 101 illustrated in FIG. 1 is a differential amplifier circuit including a main circuit 10 and a gain adjustment circuit 20.

First, the main circuit 10 will be described. The main circuit 10 is an amplifier circuit configured to amplify differential input voltage signals vinp and vinn and output the amplified signals as differential output voltage signals voutp and voutn. The main circuit 10 amplifies the differential input voltage signals vinp and vinn at an amplification factor that changes in accordance with a control voltage Vgcp and a control voltage Vgcn. The main circuit 10 outputs the amplified differential input voltage signals vinp and vinn as the differential output voltage signals voutp and voutn. The control voltage Vgcp is input to a base of a transistor Q1 and a base of a transistor Q4. The control voltage Vgcn is input to a base of a transistor Q2 and a base of a transistor Q3. The transistors Q1 to Q4 will be described later.

The main circuit 10 is, for example, a differential amplifier circuit including a differential pair circuit 15, a current divider circuit 12, and a load circuit 13. The current divider circuit 12 is connected to a high potential side of the differential pair circuit 15, and the load circuit 13 is connected to a high potential side of the current divider circuit 12. For example, the load circuit 13, the current divider circuit 12, and the differential pair circuit 15 are connected in series between a power supply line VCC and a ground line GND in this order from the power supply line VCC to the ground line GND. The power supply line VCC supplies a power supply voltage Vcc to the variable gain amplifier circuit 101, and the ground line GND applies a ground potential to the variable gain amplifier circuit 101. The main circuit 10 further includes an input node INP, an input node INN, an output node OUTP, and an output node OUTN. The main circuit 10 amplifies the differential input voltage signals vinp and vinn that are input to the input nodes INP and INN, and outputs the amplified signals as the differential output voltage signals voutp and voutn from the output nodes OUTP and OUTN. The input node INP is an example of a first input node. The input node INN is an example of a second input node. The output node OUTN is an example of a first output node. The output node OUTP is an example of a second output node.

The differential pair circuit 15 includes, for example, transistors Q5 and Q6, emitter resistors RE1 and RE2, and a constant current circuit 14. The transistor Q5 is an example of a fifth transistor. The transistor Q6 is an example of a sixth transistor. The transistors Q5 and Q6 are, for example, NPN bipolar transistors. A base of the transistor Q5 is connected to the input node INP, and an emitter of the transistor Q5 is connected to the constant current circuit 14 via the emitter resistor RE1. A base of the transistor Q6 is connected to the input node INN, and, similar to the emitter of the transistor Q5, an emitter of the transistor Q6 is connected to the constant current circuit 14 via the emitter resistor RE2. A positive-phase component vinp of the differential-input voltage signals vinp and vinn is input to the base of the transistor Q5, for example, and a negative-phase component vinn of the differential-input voltage signals vinp and vinn is input to the base of the transistor Q6, for example. The constant current circuit 14 supplies, to the transistors Q5 and Q6, a constant current Ib1 having a fixed value. The constant current circuit 14 includes a constant current source 6 electrically connected in common to the emitter of the transistor Q5 and the emitter of the transistor Q6. The constant current source 6 generates the constant current Ib1.

The positive-phase component vinp and the negative-phase component vinn constituting the differential input voltage signals vinp and vinn are a pair of complementary signals. The negative-phase component vinn has a phase different from a phase of the positive-phase component vinp by 180 degrees. For example, when the voltage of the positive-phase component vinp increases, the voltage of the negative-phase component vinn decreases, and when the voltage of the positive-phase component vinp decreases, the voltage of the negative-phase component vinn increases. When the voltage of the positive-phase component vinp reaches the maximum value (the peak value), the voltage of the negative-phase component vinn reaches the minimum value (the bottom value). When the voltage of the positive-phase component vinp reaches the minimum value (the bottom value), the voltage of the negative-phase component vinn reaches the maximum value (the peak value). Each of the positive-phase component vinp and the negative-phase component vinn may have a direct-current voltage component (a DC component) corresponding to a time average value. The negative-phase component vinn preferably has a DC component having the same magnitude as the DC component of the positive-phase component vinp. The negative-phase component vinn preferably has an amplitude equal to an amplitude of the positive-phase component vinp. Here, also for differential signals other than the differential input voltage signals vinp and vinn, the relationship between the positive-phase component and the negative-phase component may be considered to be substantially the same as the relationship between the differential input voltage signals vinp and vinn.

The differential pair circuit 15 generates second differential current signals iep and ien in accordance with the differential input voltage signals vinp and vinn. The differential pair circuit 15 is an example of a differential current circuit that generates differential current signals in accordance with differential signals. For example, a collector of the transistor Q5 outputs the positive-phase component iep of the second differential current signals iep and ien, and a collector of the transistor Q6 outputs the negative-phase components ien of the second differential current signals iep and ien. If base currents of the transistors Q5 and Q6 are ignored because the base currents are respectively smaller than collector currents thereof, the sum of the current value of the current signal iep and the current value of the current signal ien is equal to the current value of the constant current Ib1 supplied by the constant current circuit 14. For example, when the voltage value of the voltage signal (the positive-phase component) vinp is greater than the voltage value of the voltage signal (the negative-phase component) vinn, the current value of the current signal (the positive-phase component) iep is greater than the current value of the current signal (the negative-phase component) ien. Additionally, when the voltage value of the voltage signal (the positive-phase component) vinp is less than the voltage value of the voltage signal (the negative-phase component) vinn, the current value of the current signal (the positive-phase component) iep is less than the current value of the current signal (the negative-phase component) ien. Therefore, an amplitude iep−ien of the second differential current signals iep and ien increases or decreases in accordance with an amplitude vinp−vinn of the differential input voltage signals vinp and vinn. For example, when a magnitude vinp−vinn of the differential input voltage signal vinp and vinn increases, a magnitude iep−ien of the second differential current signals iep and ien increases, and when the magnitude vinp−vinn of the differential input voltage signal vinp and vinn decreases, the magnitude iep−ien of the second differential current signals iep and ien decreases. The degree of the increase or decrease in the magnitude iep−ien of the second differential current signals with respect to the increase or decrease in the magnitude vinp−vinn of the differential input voltage signals vinp and vinn can be adjusted by resistance values of the emitter resistors RE1 and RE2. For example, when the resistance values of the emitter resistors RE1 and RE2 are increased, the amount of the increase in the magnitude iep−ien of the second differential current signals in response to the increase in the magnitude vinp−vinn of the differential input voltage signals decreases. By increasing the resistance values of the emitter resistors RE1 and RE2, the range of the magnitude vinp−vinn of the differential input voltage signals in which the magnitude iep−ien of the second differential current signals changes linearly with respect to the magnitude vinp−vinn of the differential input voltage signals can be widened. The resistance value of the emitter resistor RE2 may be equal to the resistance value of the emitter resistor RE1. The electrical characteristics of the transistor Q6 may be the same as the electrical characteristics of the transistor Q5. The transistors Q5 and Q6 are also referred to as a differential pair.

The current divider circuit 12 generates third differential current signals icp and icn in accordance with the second differential current signals iep and ien. The current divider circuit 12 includes the transistors Q1, Q2, Q3, and Q4. The transistor Q1 is an example of a first transistor. The transistor Q2 is an example of a second transistor. The transistor Q3 is an example of a third transistor. The transistor Q4 is an example of a fourth transistor. The transistors Q1, Q2, Q3, and Q4 are, for example, NPN bipolar transistors. Emitters of the transistors Q1 and Q2 are both connected to a collector of the transistor Q5 of the differential pair circuit 15, and emitters of the transistors Q3 and Q4 are both connected to a collector of the transistor Q6 of the differential pair circuit 15. The control voltage Vgcp is input to bases of the transistors Q1 and Q4, and the control voltage Vgcn is input to bases of the transistors Q2 and Q3. Collectors of the transistors Q1 and Q3 are both connected to the output node OUTN and the current signal icp is output from a connection point thereof, and collectors of the transistors Q2 and Q4 are both connected to the output node OUTP and the current signal icn is output from a connection point thereof.

The second differential current signals iep and ien are divided into non-inverted divided signals and inverted divided signals in accordance with the control voltage (the first control voltage) Vgcp and the control voltage (the second control voltage) Vgcn. The current divider circuit 12 respectively adds the non-inverted divided signals and the inverted divided signals. The non-inverted divided signal has the same phase as the phase of the second differential current signals (the same phase is also referred to as in phase). The inverted divided signal has a phase different from the phase of the second differential current signals by 180 degrees (the phase difference of 180 degrees is also referred to as opposite phase). The current divider circuit 12 respectively adds the non-inverted divided signals and the inverted divided signals, and sets the magnitude icp−icn of the third differential current signals icp and icn to be smaller than the magnitude iep−ien of the second differential current signals iep and ien. The non-inverted divided signals into which the second differential current signals iep and ien are divided correspond to a first divided current icq1 output from the collector of the transistor Q1 and a fourth divided current icq4 output from the collector of the transistor Q4. The inverted divided signals into which the second current signals iep and ien are divided correspond to a second divided current icq2 output from the collector of the transistor Q2 and a third divided current icq3 output from the collector of the transistor Q3.

The transistors Q1 and Q2 divide the current signal iep into the first divided signal icq1 and the second divided signal icq2 in accordance with the control voltages Vgcp and Vgcn. If the base currents of the transistors Q1 and Q2 are ignored because they are smaller than the collector currents thereof, the sum of the current value of the first divided signal icq1 and the current value of the second divided signal icq2 is equal to the current value of the current signal iep. For example, when the control voltage Vgcp is larger than the control voltage Vgcn, the current value of the first divided signal icq1 becomes larger than the current value of the second divided signal icq2. When the control voltage Vgcp is smaller than the control voltage Vgcn, the current value of the first divided signal icq1 becomes smaller than the current value of the second divided signal icq2.

The transistors Q3 and Q4 divide the current signal ien into the third divided signal icq3 and the fourth divided signal icq4 in accordance with the control voltages Vgcp and Vgcn. If the base currents of the transistors Q3 and Q4 are ignored because they are smaller than the collector currents thereof, the sum of the current value of the third divided signal icq3 and the current value of the fourth divided signal icq4 is equal to the current value of the current signal ien. For example, when the control voltage Vgcp is larger than the control voltage Vgcn, the current value of the fourth divided signal icq4 becomes larger than the current value of the third divided signal icq3. When the control voltage Vgcp is smaller than the control voltage Vgcn, the current value of the fourth divided signal icq4 becomes smaller than the current value of the third divided signal icq3.

For example, when the control voltage Vgcp is larger than the control voltage Vgcn by a predetermined value or greater, only the first divided signal icq1 and the fourth divided signal icq4 flow, and the second divided signal icq2 and the third divided signal icq3 stop flowing. At this time, the first divided signal icq1 becomes equal to the current signal iep, and the fourth divided signal icq4 becomes equal to the current signal ien. In this state, even if the control voltage Vgcp is further increased to be larger than the control voltage Vgcn, the first divided signal icq1 and the fourth divided signal icq4 do not increase. This state is also referred to as a saturated state. In the saturated state, the non-inverted divided signals including the first divided signal icq1 as the positive-phase component and the fourth divided signal icq4 as the negative-phase component is equal to the second differential current signals iep and ien. As the magnitude iep−ien of the second current signals iep and ien increases, the magnitude icq1−icq4 of the non-inverted divided signals increases.

When the control voltage Vgcn is larger than the control voltage Vgcp by a predetermined value or greater, only the second divided signal icq2 and the third divided signal icq3 flow, and the first divided signal icq1 and the fourth divided signal icq4 stop flowing. At this time, the second divided signal icq2 becomes equal to the current signal ien, and the third divided signal icq3 becomes equal to the current signal iep. In this state, even if the control voltage Vgcn is further increased to be larger than the control voltage Vgcp, the second divided signal icq2 and the third divided signal icq3 do not increase, which is in the saturated state. In this saturated state, the inverted divided signal including the second divided signal icq2 as the positive-phase component and the third divided signal icq3 as the negative-phase component is inverted in phase with respect to the second differential current signals iep and ien. When the magnitude iep−ien of the second differential current signals iep and ien increase, the magnitude icq2−icq3=ien−iep=−(iep−ien) of the inverted divided signals decrease (the absolute value of the magnitude of the inverted divided signals increases).

Therefore, when a voltage difference between the control voltage Vgcp and the control voltage Vgcn is smaller than the predetermined value, the current divider circuit 12 generates the third differential current signals icp and icn by combining the non-inverted divided signals and the inverted divided signals generated in accordance with the voltage difference. The magnitude icp−icn of the third differential current signals icp and icn is less than or equal to the magnitude iep−ien of the second differential current signals iep and ien.

A load resistance element RL1 is an example of a first load resistance element. A load resistance element RL2 is an example of a second load resistance element.

The load circuit 13 generates the differential output voltage signals voutp and voutn in accordance with the third differential current signals icp and icn. The load circuit 13 includes the load resistance elements RL1 and RL2. The load resistance element RL1 is connected between the transistors Q1 and Q3; and the power supply line VCC. The load resistance element RL1 has an end (one end) connected to the collector of the transistor Q1 and the collector of the transistor Q3, and an end (the other end) connected to the power supply line VCC. One end of the load resistance element RL1 is connected to the output node OUTN. The load resistance element RL2 is connected between the transistors Q2 and Q4; and the power supply line VCC. The load resistance element RL2 has an end (one end) connected to the collector of the transistor Q2 and the collector of the transistor Q4, and an end (the other end) connected to the power supply line VCC. One end of the load resistance element RL2 is connected to the output node OUTP. The load resistance element RL2 may have the same resistance value as the load resistance element RL1.

The output node OUTN is connected to one end of the load resistance element RL1, and further connected to the collector of the transistor Q1 and the collector of the transistor Q3. The output node OUTP is connected to one end of the load resistance element RL2, and further connected to the collector of the transistor Q2 and the collector of the transistor Q4.

Next, an operation of the main circuit 10 will be described.

The differential input voltage signals vinp and vinn are respectively input to the bases of the transistors Q5 and Q6, and the differential pair circuit 15 generates the second differential current signals iep and ien in accordance with the differential input voltage signals vinp and vinn. As the magnitude vinp−vinn of the differential input voltage signals vinp and vinn increases, the magnitude iep−ien of the second differential current signals iep and ien increases. The second differential current signals iep and ien are input to the current divider circuit 12.

The current divider circuit 12 generates the third differential current signals icp and icn in accordance with the second differential current signals iep and ien by the gain set by the control voltages Vgcp and Vgcn. As the magnitude iep−ien of the second differential current signals iep and ien increases, the magnitude icp−icn of the third differential current signals icp and icn increases. The third differential current signals icp and icn are input to the load circuit 13. The current signal icp flows through the load resistance element RL1 to be converted into a voltage signal voutn. Additionally, the current signal icn flows through the load resistance element RL2 to be converted into a voltage signal voutp. More specifically, for example, in the case where the load resistance element RL2 has a resistance value equal to the resistance value of the load resistance element RL1, when the current signal icp is larger than the current signal icn, the voltage drop of the load resistance element RL1 becomes larger than the voltage drop of the load resistance element RL2, and the output voltage signal voutp becomes higher (larger) than the output voltage signal voutn. When the current signal icp is smaller than the current signal icn, the voltage drop of the load resistance element RL1 becomes smaller than the voltage drop of the load resistance element RL2, and the output voltage signal voutp becomes lower (smaller) than the output voltage signal voutn. Therefore, the third differential current signals icp and icn flow through the load circuit 13, so that the differential output voltage signals voutp and voutn are generated at the output nodes OUTP and OUTN. That is, the third differential current signals icp and icn are converted into the differential output voltage signals voutp and voutn by the load circuit 13. As the magnitude icp−icn of the third differential current signals icp and icn increases, the magnitude voutp−voutn of the differential output voltage signals voutp and voutn increases, and as the magnitude icp−icn of the third differential current signals icp and icn decreases, the magnitude voutp−voutn of the differential output voltage signals voutp and voutn decreases.

In the current divider circuit 12, the second differential current signals iep and ien are divided into non-inverted divided signals and inverted divided signals in accordance with the control voltages Vgcp and Vgcn. More specifically, the collector current of the transistor Q1 (the first divided signal icq1) and the collector current of the transistor Q4 (the fourth divided signal icq4), which constitute the non-inverted divided signals, can be adjusted by the control voltages Vgcp and Vgcn. Similarly, the collector current of the transistor Q2 (the second divided signal icq2) and the collector current of the transistor Q3 (the third divided signal icq3), which constitute the inverted divided signals, can be adjusted by the control voltages Vgcp and Vgcn. For example, when the control voltage Vgcp is set to be larger than the control voltage Vgcn, the non-inverted divided signals become larger than the inverted divided signals. When the control voltage Vgcp is set smaller than the control voltage Vgcn, the non-inverted divided signals become smaller than the inverted divided signals.

As described above, the non-inverted divided signal and the inverted divided signal are opposite in phase to each other. Therefore, by adjusting the control voltages Vgcp and Vgcn, the magnitude of the third differential current signals icp and icn change, and the differential output voltage signals voutp and voutn change. As described, the gain of the main circuit 10 of the variable gain amplifier circuit 101 can be changed by adjusting the control voltages Vgcp and Vgcn. The gain of the main circuit 10 is expressed by (voutp−voutn)/(vinp−vinn).

As described above, when the control voltage Vgcp is higher than the control voltage Vgcn by the predetermined value or greater (a case 1), the third differential current signals icp and icn become equal to the second differential current signals iep and ien. When the control voltage Vgcp decreases to be lower than the control voltage Vgcp in the case 1 and the control voltage Vgcp becomes higher than the control voltage Vgcn by a value not exceeding the predetermined value (a case 2), the non-inverted divided signal decreases in comparison with the case 1, and the inverted divided signal having a phase opposite to the phase of the non-inverted divided signal increases. Thus, the positive-phase component icp of the third differential current signals icp and icn decreases, the voltage drop occurring in the load resistance element RL1 decreases, and the output voltage signal voutn increases. At this time, the negative-phase component icn of the third differential current signals icp and icn increases, the voltage drop occurring in the load resistance element RL2 increases, and the output voltage signal voutp decreases. Therefore, the magnitude voutp−voutn of the differential output voltage signals voutp and voutn decreases, and the gain of the main circuit 10 decreases.

When the control voltage Vgcp is equal to the control voltage Vgcn, the non-inverted divided signal and the inverted divided signal have the same amplitude and opposite phases to cancel each other. Therefore, the current flowing through the load resistance elements RL1 and RL2 becomes zero, the amplitude voutp−voutn of the differential output voltage signals voutp and voutn becomes zero, and the gain of the main circuit 10 becomes zero.

When the control voltage Vgcp is lower than the control voltage Vgcn, the inverted divided signal becomes larger than the non-inverted divided signal. Therefore, the third differential current signals icp and icn becomes opposite in phase to the second differential current signals iep and ien, and the phase of the differential output voltage signals voutp and voutn generated by the load resistance elements RL1 and RL2 is inverted by 180 degrees with respect to the phase of the differential input voltage signals vinp and vinn.

From the above, it is found that the phase of the differential output voltage signals voutp and voutn is inverted by 180 degrees with respect to the phase of the differential input voltage signals vinp and vinn, depending on the setting of the control voltages Vgcp and Vgcn (a circuit having such a configuration is also referred to as a four quadrant Gilbert cell type variable gain amplifier). When the circuit is used for optical communication, it is not preferable that the phase is inverted by 180 degrees when the gain is adjusted. The phase inversion can be prevented by limiting the setting range of the control voltages Vgcp and Vgcn. However, if the setting range of the control voltages Vgcp and Vgcn is narrowed more than necessary in consideration of fluctuations in the circuit characteristics, there is a problem that the variable width of the gain of the main circuit 10 is narrowed.

Next, the gain adjustment circuit 20 will be described.

The gain adjustment circuit 20 includes a generation circuit 21 and a limit circuit 30.

The generation circuit 21 generates a pair of control voltages Vgcp and Vgcn. In this example, the generation circuit 21 generates the pair of control voltages Vgcp and Vgcn in accordance with a single control signal Vgc. The generation circuit 21 is, for example, a differential amplifier circuit configured to generate the control voltages Vgcp and Vgcn in accordance with a difference voltage between the control signal Vgc and a reference signal Vref. The control signal Vgc is a signal for setting the gain of the main circuit 10, and is also referred to as a setting signal. For example, an external control circuit adjusts the voltage of the control signal Vgc in accordance with the magnitude of the amplitude of the differential output voltage signals voutp and voutn, thereby performing automatic gain control. Here, the description assumes that a specific voltage is externally given as the control signal Vgc in order to set the gain of the main circuit 10. The generation circuit 21 supplies the control voltage Vgcp to the base of the transistor Q1 and the base of the transistor Q4 in the current divider circuit 12 via the first signal line 22. The generation circuit 21 supplies the control voltage Vgcn to the base of the transistor Q2 and the base of the transistor Q3 in the current divider circuit 12 via the second signal line 23.

The generation circuit 21 increases the control voltage Vgcp and decreases the control voltage Vgcn when the control signal Vgc increases, and decreases the control voltage Vgcp and increases the control voltage Vgcn when the control signal Vgc decreases. Therefore, when the control signal Vgc increases, the gain of the main circuit 10 increases, and when the control signal Vgc decreases, the gain of the main circuit 10 decreases.

The generation circuit 21 operates so that an average voltage Vgcave (=(Vgcp+Vgcn)/2) of the control voltage Vgcp and the control voltage Vgcn is always kept constant. When the control voltage Vgcp is higher than the average voltage Vgcave, the control voltage Vgcn is lower than the average voltage Vgcave. When the control voltage Vgcp is lower than the average voltage Vgcave, the control voltage Vgcn is higher than the average voltage Vgcave. An absolute value of a difference between the control voltage Vgcp and the average voltage Vgcave is equal to an absolute value of a difference between the control voltage Vgcn and the average voltage Vgcave.

Figure 2:
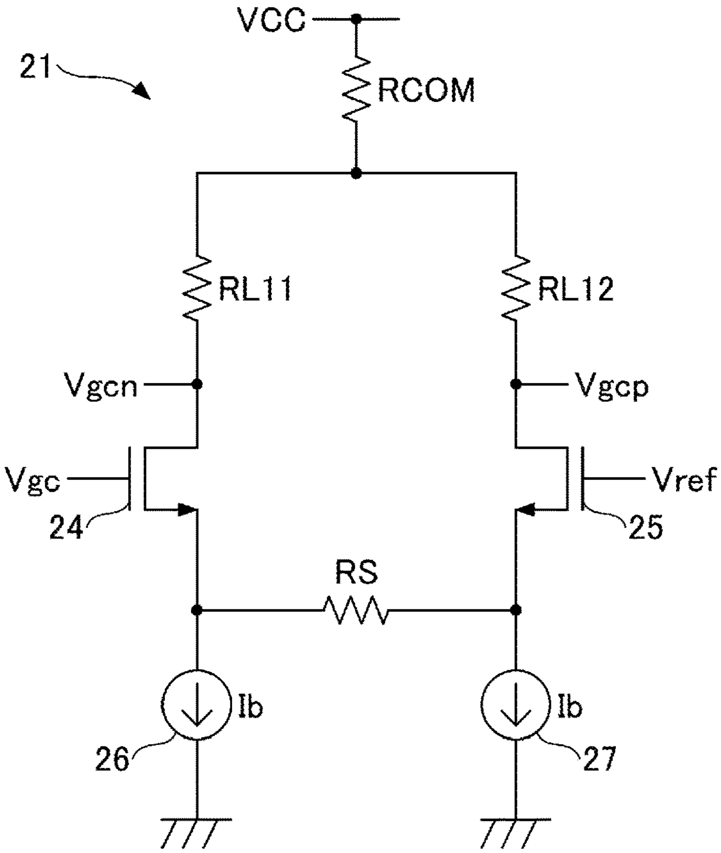
FIG. 2 is a diagram illustrating a configuration example of a generation circuit configured to generate a pair of control voltages Vgcp and Vgcn.

FIG. 2 is a diagram illustrating a configuration example of the generation circuit configured to generate the pair of control voltages Vgcp and Vgcn. The generation circuit 21 includes, for example, a resistance element RCOM, a resistance element RL11, a resistance element RL12, a resistance element RS, a pair of transistors 24 and 25 and, and a pair of constant current sources 26 and 27.

The transistor 24 is a field-effect transistor (FET) including a gate that receives the control signal Vgc, a source connected to the constant current source 26, and a drain connected to the resistance element RL11. The transistor 25 is an FET including a gate that receives the reference signal Vref having a constant voltage, a source connected to the constant current source 27, and a drain connected to the resistance element RL12. The constant current source 27 generates a constant current Ib having a current value equal to a current value Ib generated by the constant current source 26. The resistance element RS is connected between the source of the transistor 24 and the source of the transistor 25. The resistance element RCOM is connected between a common connection node of the resistance element RL11 and the resistance element RL12; and the power supply line VCC.

When the control signal Vgc becomes larger than the reference signal Vref, a drain current of the transistor 24 increases and a drain current of the transistor 25 decreases by the differential amplifying operation. Because the current flowing through the resistance element RL12 decreases as the current flowing through the resistance element RL11 increases, the control voltage Vgcn output from the drain of the transistor 24 becomes lower than the control voltage Vgcp output from the drain of the transistor 25. As described above, the generation circuit 21 has the configuration illustrated in FIG. 2, so that when the control signal Vgc becomes larger than the reference signal Vref, the generation circuit 21 sets the control voltage Vgcp to be higher than the control voltage Vgcn.

Conversely, when the control signal Vgc becomes smaller than the reference signal Vref, the drain current of the transistor 24 decreases and the drain current of the transistor 25 increases by the differential amplifying operation. Because the current flowing through the resistance element RL12 increases as the current flowing through the resistance element RL11 decreases, the control voltage Vgcn output from the drain of the transistor 24 becomes higher than the control voltage Vgcp output from the drain of the transistor 25. As described above, the generation circuit 21 has the configuration illustrated in FIG. 2, so that when the control signal Vgc becomes smaller than the reference signal Vref, the generation circuit 21 sets the control voltage Vgcp to be lower than the control voltage Vgcn.

In FIG. 1, the limit circuit 30 limits a voltage difference ΔV between the control voltage Vgcp and the control voltage Vgcn to be greater than or equal to a limit value VL so that a difference voltage ΔE between the output node OUTN and the output node OUTP does not become lower than a setting voltage Vs. The difference voltage ΔE is also referred to as an amplitude |voutp−voutn| of the differential output voltage signals voutp and voutn.

The limit circuit 30 limits the voltage difference ΔV of the control voltages to be greater than or equal to the limit value VL, so that when the control signal Vgc input to the generation circuit 21 changes such that the voltage difference ΔV becomes less than the limit value VL, the voltage difference ΔV can be prevented from becoming less than the limit value VL. In other words, when the generation circuit 21 generates the control voltages Vgcp and Vgcn such that the control voltage Vgcp is lower than the control voltage Vgcn, the limit circuit 30 prevents the control voltage Vgcp from being lower than the control voltage Vgcn. The control voltage Vgcp is prevented from becoming lower than the control voltage Vgcn, so that the phase of the differential output voltage signals voutp and voutn can be prevented from being inverted by 180 degrees with respect to the phase of the differential input voltage signals vinp and vinn.

When the difference voltage ΔE becomes lower than the setting voltage Vs, the limit circuit 30 operates to increase the control voltage Vgcp and decrease the control voltage Vgcn, regardless of the output of the generation circuit 21. Because the voltage difference ΔV is prevented from becoming smaller than the limit value VL by the control voltage Vgcp increasing and the control voltage Vgcn decreasing, the control voltage Vgcp is prevented from becoming lower than the control voltage Vgcn. The control voltage Vgcp is prevented from becoming lower than the control voltage Vgcn, so that the phase of the differential output voltage signals voutp and voutn can be prevented from being inverted by 180 degrees with respect to the phase of the differential input voltage signals vinp and vinn.

The limit circuit 30 includes an amplitude detection circuit 31, an operational amplifier OPA1, and transistors MN1, MN2, MP1, and MP2. For example, the transistors MN1 and MN2 are n-type channel FETs, and the transistors MP1 and MP2 are p-type channel FETs.

The amplitude detection circuit 31 detects the amplitude |voutp−voutn| of the differential output voltage signals voutp and voutn, and generates an amplitude monitor signal Vmon in accordance with a detection result. The amplitude monitor signal Vmon is a signal representing a detection value of the amplitude |voutp−voutn|. The amplitude monitor signal Vmon is input to an inverting input terminal (the sign −) of the operational amplifier OPA1. A limit voltage Vlimit is input to a non-inverting input terminal (the sign +) of the operational amplifier OPA1. The limit voltage Vlimit is a setting voltage corresponding to the setting voltage Vs above. The operational amplifier OPA1 compares the amplitude monitor signal Vmon with the limit voltage Vlimit.

When the differential voltage ΔE between the output node OUTN and the output node OUTP (the amplitude |voutp−voutn| of the differential output voltage signals voutp and voutn) is higher than the setting voltage Vs, a voltage value of the amplitude monitor signal Vmon is greater than or equal to the limit voltage Vlimit. When the voltage value of the amplitude monitor signal Vmon is greater than or equal to the limit voltage Vlimit, the output of the operational amplifier OPA1 becomes 0V, and when the voltage value of the amplitude monitor signal Vmon becomes less than the limit voltage Vlimit, the output of the operational amplifier OPA1 increases from 0V.

The output of the operational amplifier OPA1 is input to gates of the transistors MN1 and MN2. A drain of the transistor MN2 is connected to a signal line 23 of the control voltage Vgcn. A source of the transistor MN2 is connected to the ground. A source of the transistor MN1 is connected to the ground. A drain of the transistor MN1 is connected to a drain of the transistor MP1. A gate of the transistor MP1 is connected to a drain of the transistor MP1 and a gate of the transistor MP2. A drain of the transistor MP2 is connected to a signal line 22 of the control voltage Vgcp. The sources of the transistors MP1 and MP2 are connected to the power supply line VCC. The transistors MP1 and MP2 constitute a current mirror circuit. The current mirror circuit outputs, from the drain of the transistor MP2, a current in accordance with a drain current of the transistor MP1.

When the voltage of the output of the operational amplifier OPA1 is 0V, the transistors MN1 and MN2 are in the off state, and the transistors MP1 and MP2 are also in the off state. Here, threshold voltages of the transistors MN1 and MN2 are set to a value greater than 0V. Therefore, a point between the drain and the source of each of the transistors MN1 and MN2, MP1, and MP2 is high impedance, and thus the control voltages Vgcp and Vgcn generated by the generation circuit 21 are input to the main circuit 10 as is.

When the differential voltage ΔE between the output node OUTN and the output node OUTP (the amplitude |voutp−voutn| of the differential output voltage signals voutp and voutn) becomes less than the setting voltage Vs, the voltage value of the amplitude monitor signal Vmon becomes less than the limit voltage Vlimit. When the voltage value of the amplitude monitor signal Vmon becomes lower than the limit voltage Vlimit, the output of the operational amplifier OPA1 increases from 0V, and when the voltage value of the amplitude monitor signal Vmon exceeds the limit voltage Vlimit, the transistor MN2 is in the on state, and thus the control voltage Vgcn is pulled down to the ground by the on-resistance of the transistor MN2 and decreases. Further, the transistor MN1 is also in the on state, and the collector current of the transistor MN1 is input to the current mirror circuit, so that the transistor MP2 is also in the on state. The transistor MP2 is in the on state, and thus the control voltage Vgcp is pulled up to the power supply voltage of the power supply line VCC by the on-resistance of the transistor MP2 and increases. This causes the control voltages Vgcp and Vgcn to change in a direction in which the gain of the main circuit 10 increases. The increase in the gain of the main circuit 10 increases the amplitude of the differential output voltage signals voutp and voutn.

As described above, when the difference voltage ΔE becomes less than the setting voltage Vs, the limit circuit 30 turns on the transistor MP2 and the transistor MN2 regardless of the change in the control signal Vgc. When the transistor MP2 and the transistor MN2 are turned on, the control voltage Vgcp increases and the control voltage Vgcn decreases, so that the voltage difference ΔV can be prevented from becoming less than the limit value VL. By the voltage difference ΔV being prevented from becoming less than the limit value VL, the control voltage Vgcp is prevented from becoming less than the control voltage Vgcn. Therefore, the phase of the differential output voltage signals voutp and voutn can be prevented from being inverted by 180 degrees with respect to the phase of the differential input voltage signals vinp and vinn.

Therefore, the amplitude of the differential output voltage signals voutp and voutn is controlled to a value greater than or equal to the lower limit value (the setting voltage Vs) set as the limit voltage Vlimit by such a negative feedback operation of the limit circuit 30. With this, when the operational amplifier OPA1 detects the voltage value of the amplitude monitor signal Vmon that is less than the limit voltage Vlimit, the gain of the main circuit 10 is increased so that the voltage signals voutp and voutn have a constant amplitude (the lower limit value). When the operational amplifier OPA1 detects the voltage value of the amplitude monitor signal Vmon that is less than the limit voltage Vlimit, the control voltage Vgcp is prevented from becoming lower than the control voltage Vgcn. Therefore, the phase of the differential output voltage signals voutp and voutn can be prevented from being inverted by 180 degrees with respect to the phase of the differential input voltage signals vinp and vinn.

Figure 3:
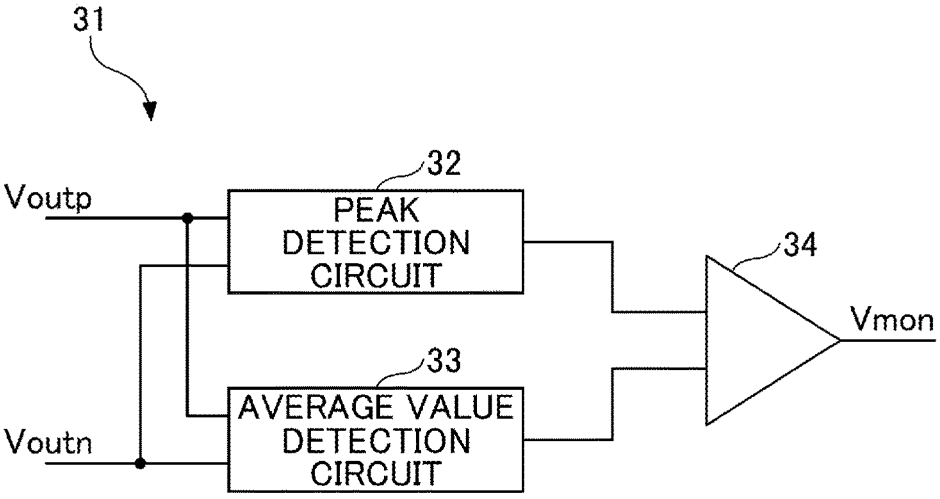
FIG. 3 is a diagram illustrating a configuration example of an amplitude detection circuit.

FIG. 3 is a diagram illustrating a configuration example of the amplitude detection circuit. The amplitude detection circuit 31 includes a peak detection circuit 32, an average value detection circuit 33, and an amplifier 34.

The peak detection circuit 32 detects a peak value of the voltage difference (the amplitude |voutp−voutn|) between the output voltage signal voutp and the output voltage signal voutn, and outputs a voltage having a magnitude corresponding to the detected peak value. The average value detection circuit 33 detects an average value (the magnitude of the direct current component) of the amplitude |voutp−voutn|, and outputs a voltage having a magnitude corresponding to the detected average value. The amplifier 34 outputs a voltage (half of the amplitude |voutp−voutn|) corresponding to a difference between an output voltage of the peak detection circuit 32 and an output voltage of the average value detection circuit 33. Therefore, the voltage (the amplitude monitor signal Vmon) output from the amplifier 34 becomes a voltage corresponding to the magnitude of the amplitude |voutp−voutn|. The amplifier 34 is, for example, a differential amplifier circuit. The amplifier 34 outputs, for example, only one component (the positive-phase component) of the differential output signals generated in accordance with the difference between the output voltage of the peak detection circuit 32 and the output voltage of the average value detection circuit 33 as the amplitude monitor signal Vmon.

Figure 4:
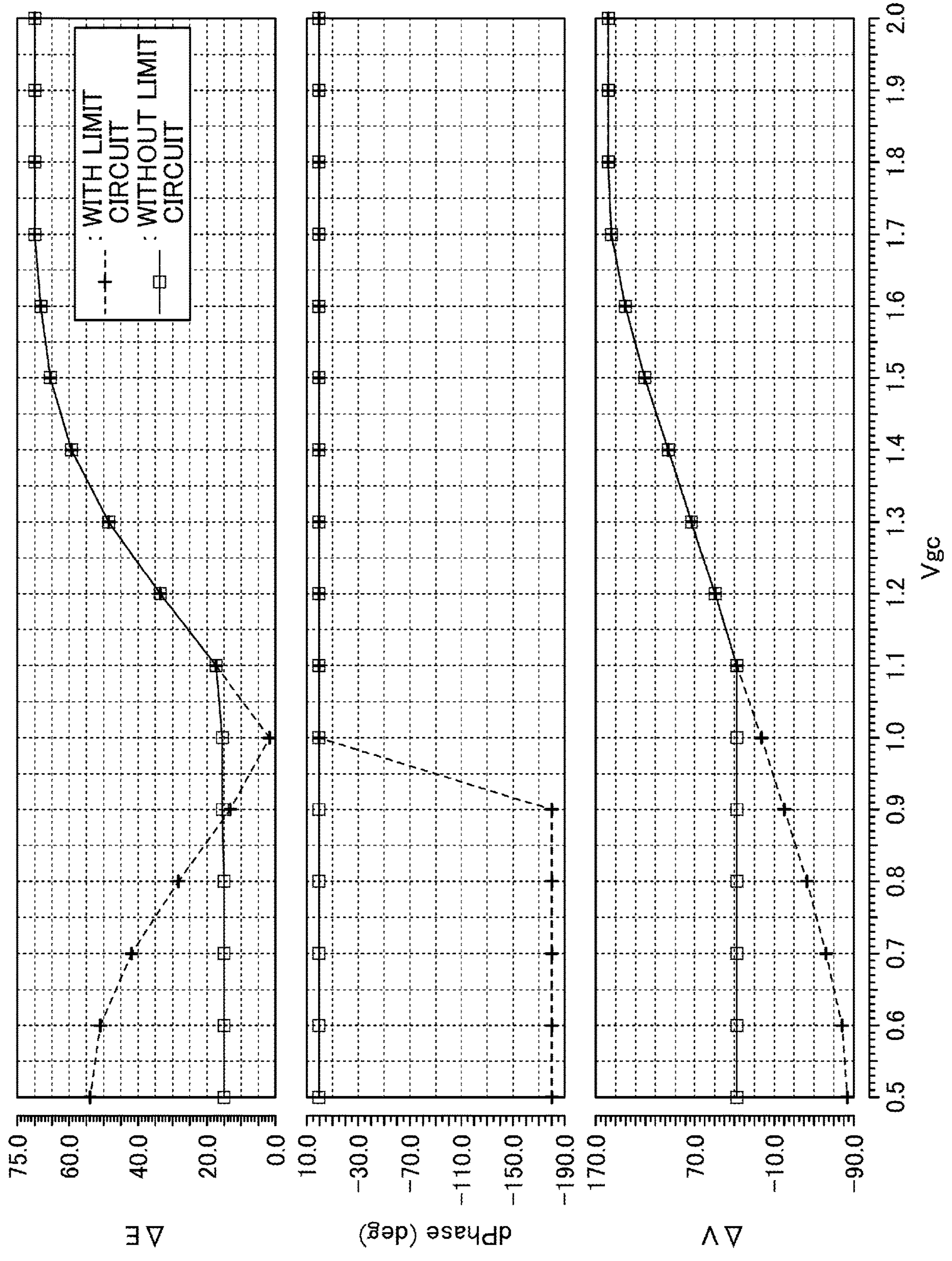
FIG. 4 is graphs illustrating electrical characteristics of the variable gain amplifier circuit of FIG. 1.

FIG. 4 is graphs illustrating the electrical characteristics of the variable gain amplifier circuit 101 of FIG. 1. The electrical characteristics illustrated in FIG. 4 indicate results of circuit simulation. FIG. 4 plots the output amplitude ΔE, the phase differences dPhase, and the voltage differences ΔV when the magnitude vinp−vinn of the differential input voltage signals vinp and vinn is a sinusoidal signal of 1 GHz and the control signal Vgc (the horizontal axis) is swept in a range of 0.5 V to 2.0 V. The output amplitude ΔE and the voltage difference ΔV are expressed in arbitrary units. The output amplitude ΔE represents the amplitude |voutp−voutn| of the differential output voltage signals voutp and voutn. The phase difference dPhase represents the phase of the differential output voltage signals voutp and voutn with respect to the differential input voltage signals vinp and vinn (the phase difference between the differential input voltage signals vinp and vinn and the differential output voltage signals voutp and voutn). The voltage difference ΔV represents the voltage difference Vgcp−Vgcn between the differential control voltages Vgcp and Vgcn. FIG. 4 illustrates a case where the limit circuit 30 is not provided (a comparative example) and a case where the limit circuit 30 is provided (the embodiment).

In the case where the limit circuit 30 is not provided (the comparative example), as the control signal Vgc gradually decreases from 2.0 V, the output amplitude ΔE decreases and the gain of the main circuit 10 decreases. However, in a region where the control signal Vgc is lower than 1.0 V, the gain of the main circuit 10 increases, conversely, and the phase shift dPhase is inverted by 180 degrees. This is because the voltage difference ΔV (the amplitude Vgcp−Vgcn) is in the negative region.

With respect to the above, when the limit circuit 30 is provided (the embodiment), the voltage difference ΔV (the amplitude Vgcp−Vgcn) is limited to a constant value and the output amplitude ΔE is also limited to a constant value when the control signal Vgc is less than or equal to 1.1 V. Additionally, the phase difference dPhase is not inverted in the entire range of the control signal Vgc. In this example, the generation circuit 21 generates the control voltages Vgcp and Vgcn so that the control voltages Vgcp and Vgcn become equal to each other (the voltage difference ΔV becomes zero) when the control signal Vgc becomes 1.0 V. In the embodiment, for example, assuming that the output amplitude ΔE is 17 (the arbitrary unit) when the control signal Vgc is set to 1.1 V, the limit voltage Vlimit is set to a voltage equal to the voltage value of the amplitude monitor signal Vmon when the output amplitude ΔE is 17 (the arbitrary unit). With this, even when the control signal Vgc becomes smaller than 1.1 V, the voltage difference ΔV is maintained at the limit value VL=27 (the arbitrary unit), and the output amplitude ΔE is maintained at 15 (the arbitrary unit).

Figure 5:
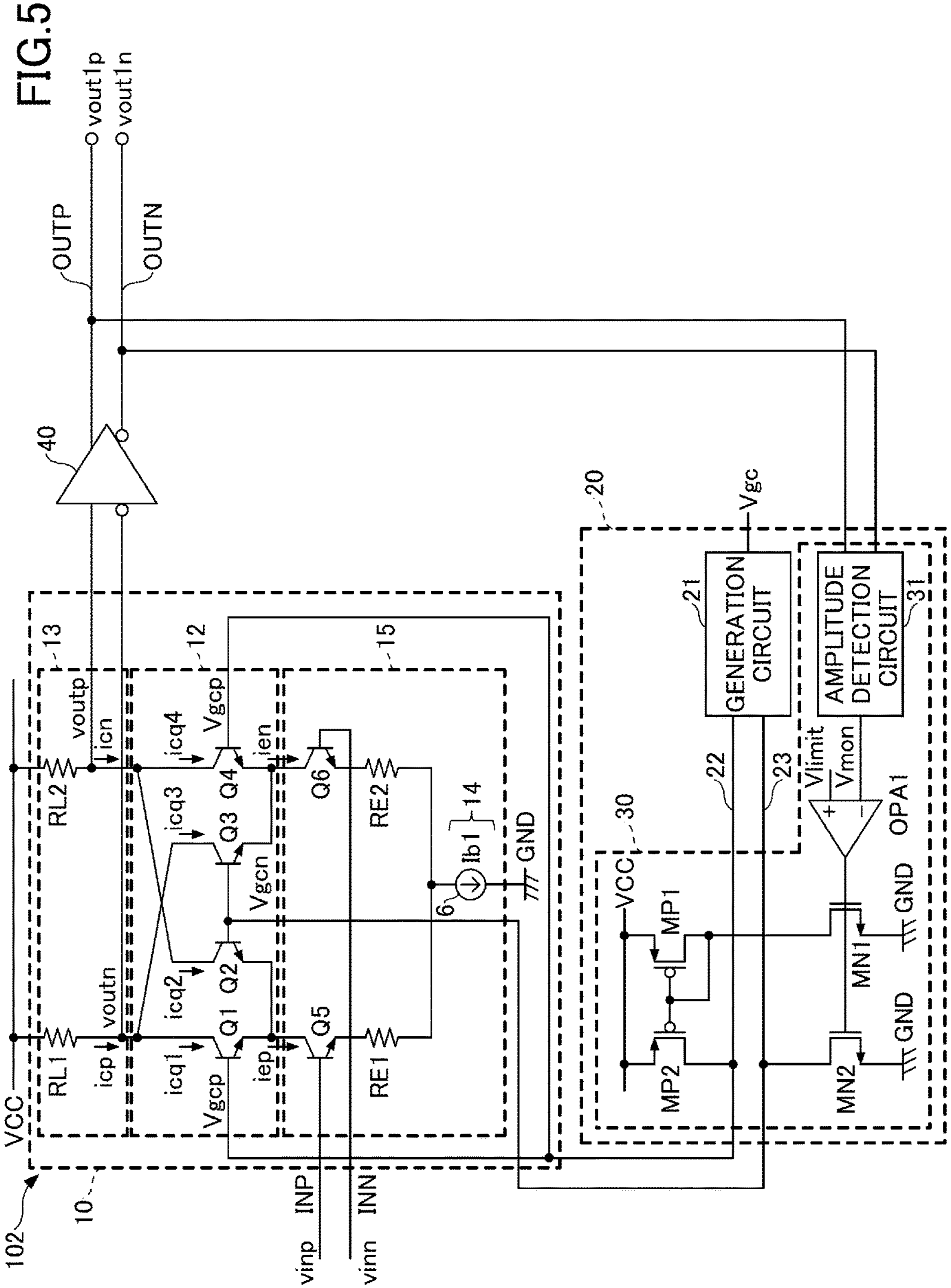
FIG. 5 is a diagram illustrating a configuration example of a variable gain amplifier circuit according to a second embodiment.

FIG. 5 is a diagram illustrating a configuration example of a variable gain amplifier circuit according to a second embodiment. In the second embodiment, the description of substantially the same configuration, operation, and effect as those of the first embodiment will be omitted or simplified by incorporating the above description.

In the variable gain amplifier circuit 101 of FIG. 1, the amplitude of the differential output voltage signals voutp and voutn of the main circuit 10 is detected by the amplitude detection circuit 31. With respect to the above, in a variable gain amplifier circuit 102 of FIG. 5, the amplitude |vout1p−vout1n| of signals vout1p and vout1n obtained by a differential amplifier circuit 40, in a stage subsequent to the main circuit 10, amplifying the differential output voltage signals voutp and voutn is detected by the amplitude detection circuit 31. The differential amplifier circuit 40 is further cascaded to the main circuit 10 as a subsequent stage circuit of the main circuit 10. The differential amplifier circuit 40 is inserted between the main circuit 10 and the output nodes OUTP and OUTN of the variable gain amplifier circuit 101 of FIG. 1.

The variable gain amplifier circuit 102 includes the differential amplifier circuit 40, and thus can limit, to the minimum value, the output amplitude of the differential amplifier (the differential amplifier circuit 40), which is different from the differential amplifier (the main circuit 10) in which the gain is controlled. Therefore, the phase inversion of the output signal due to the characteristic fluctuation of the subsequent stage circuit can be prevented.

Figure 6:
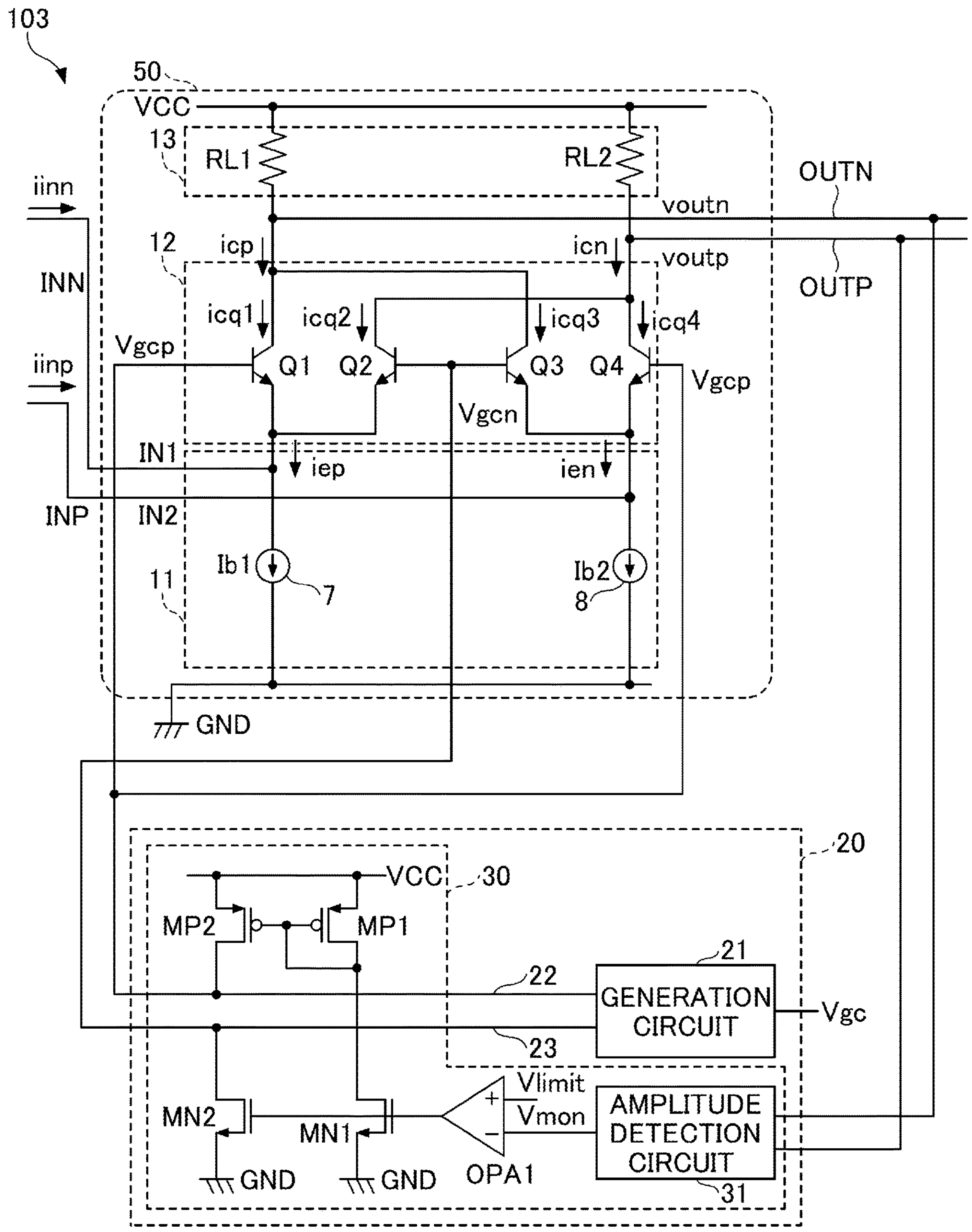
FIG. 6 is a diagram illustrating a configuration example of a variable gain amplifier circuit according to a third embodiment.

FIG. 6 is a diagram illustrating a configuration example of a variable gain amplifier circuit according to a third embodiment. In the third embodiment, the description of substantially the same configuration, operation, and effect as those of the first and second embodiments will be omitted or simplified by incorporating the above description.

In the variable gain amplifier circuit 101 of FIG. 1, the main circuit 10 is an amplifier circuit that amplifies the differential input voltage signals vinp and vinn and outputs the amplified signals as the differential output voltage signals voutp and voutn. With respect to the above, in a variable gain amplifier circuit 103 of FIG. 6, a main circuit 50 is an amplifier circuit that amplifies differential input current signals iinp and iinn and outputs the amplified signals as the differential output voltage signals voutp and voutn.

The variable gain amplifier circuit 103 illustrated in FIG. 6 is a differential amplifier circuit including the main circuit 50 and the gain adjustment circuit 20.

The main circuit 50 amplifies the differential input current signals iinp and iinn input to input nodes IN1 and IN2 at an amplification factor that changes in accordance with the control voltages Vgcp and Vgcn. The main circuit 50 outputs the differential output voltage signals voutp and voutn from the output node OUTP and the output node OUTN in accordance with the amplified differential input current signals iinp and iinn.

The main circuit 50 is a differential amplitude adjustment circuit including a constant current circuit 11, the current divider circuit 12, and the load circuit 13. The current divider circuit 12 is connected to a high potential side of the constant current circuit 11, and the load circuit 13 is connected to a high potential side of the current divider circuit 12. For example, the load circuit 13, the current divider circuit 12, and the constant current circuit 11 are connected in series in this order from the power supply line VCC to the ground line between the power supply line VCC and the ground line. The main circuit 10 further includes the input node INP, the input node INN, the output node OUTP, and the output node OUTN. The main circuit 50 changes the current gain from zero to one in accordance with the first control voltage Vgcp and the second control voltage Vgcn. The input current signal iinp is input to the input node IN2 of the constant current circuit 11 via the input node INP, and the second input current iinn is input to the input node IN1 of the constant current circuit 11 via the input node INN. The output node OUTN is an example of the first output node. The output node OUTP is an example of the second output node.

The constant current circuit 11 includes the input node IN1 and the input node IN2 to which the first current signals iinp and iinn are input, a first constant current source 7 connected to the input node IN1, and a second constant current source 8 connected to the input node IN2. The first constant current source 7 is connected between the input node IN1 and the ground, and supplies a constant first constant current Ib1. The second constant current source 8 is connected between the input node IN2 and the ground, and supplies a constant second constant current Ib2. The second constant current Ib2 has a current value equal to a current value of the first constant current Ib1.

The constant current circuit 11 generates second differential current signals iep and ien in accordance with the first differential current signals iinp and iinn. The constant current circuit 11 is an example of the differential current circuit that generates differential current signals in accordance with differential signals. The current signal iep, which is a positive phase component of the second current signals iep and ien, is generated by the constant current circuit 11 subtracting the input current signal iinn from the first constant current Ib1. The input current signal iinn is a negative phase component of the first differential current signals iinp and iinn. As the input current signal iinn increases, the current signal iep decreases, and as the input current signal iinn decreases, the current signal iep increases. The current signal ien, which is the negative phase component of the second current signals iep and ien, is generated by the constant current circuit 11 subtracting the input current signal iinp from the second constant current Ib2. The input current signal iinp is a positive phase component of the first differential current signals iinp and iinn. As the input current signal iinp increases, the current signal ien decreases, and as the input current signal iinp decreases, the current signal ien increases. Therefore, as the magnitude iinp−iinn of the first differential current signals iinp and iinn increases, the magnitude iep−ien of the second differential current signals iep and ien increases, and as the magnitude iinp−iinn of the first differential current signals iinp and iinn decreases, the magnitude iep−ien of the second differential current signals iep and ien decreases.

The current divider circuit 12 generates the third differential current signals icp and icn in accordance with the second differential current signals iep and ien. The current divider circuit 12 includes the transistors Q1, Q2, Q3, and Q4. The transistors Q1, Q2, Q3, and Q4 are connected between the input nodes IN1 and IN2 and the first and second output nodes OUTN and OUTP.

The current divider circuit 12 respectively adds the non-inverted divided signals and the inverted divided signals that are divided from the second differential current signals iep and ien in accordance with the first control voltage Vgcp and the second control voltage Vgcn. The current divider circuit 12 respectively adds the inverted divided signals and the non-inverted divided signals, and sets the amplitude of the third differential current signals icp and icn to be smaller than the amplitude of the second differential current signals iep and ien. The configuration and operation of the current divider circuit 12 are the same as those of the first embodiment illustrated in FIG. 1, and thus, detailed description thereof is omitted.

The load circuit 13 generates the differential output voltage signals voutp and voutn in accordance with the third differential current signals icp and icn. The load circuit 13 includes the first load resistance element RL1 and the second load resistance element RL2. The first load resistance element RL1 is connected to the first node OUTN and is connected between the power supply line VCC and the first node OUTN in this example. The second load resistance element RL2 is connected to the second output node OUTP and is connected between the power supply line VCC and the second output node OUTP in this example. The second load resistance element RL2 has, for example, a resistance value equal to the resistance value of the first load resistance element RL1. The configuration and operation of the load circuit 13 are the same as those of the first embodiment illustrated in FIG. 1, and thus, detailed description thereof is omitted.

Because the main circuit 50 outputs the differential output voltage signals voutp and voutn in accordance with the differential input current signals iinp and iinn, the gain (voutp−voutn)/(iinp−iinn) is represented by impedance. In order to decrease the gain of the main circuit 50, the second control voltage Vgcn is set to be larger than the first control voltage Vgcp, and in order to increase the gain of the main circuit 50, the second control voltage Vgcn is set to be smaller than the first control voltage Vgcp.

As described, the gain of the main circuit 50 of the variable gain amplifier circuit 103 can be changed by adjusting the control voltages Vgcp and Vgcn.

In the main circuit 50 of FIG. 6, as in the main circuit 10 of FIG. 1, the phase of the differential output voltage signals voutp and voutn may be inverted by 180 degrees with respect to the phase of the differential input current signals iinp and iinn depending on the setting of the control voltages Vgcp and Vgcn. In order to prevent such phase inversion of the output, the variable gain amplifier circuit 103 of FIG. 6 includes the gain adjustment circuit 20 having the same configuration as the gain adjustment circuit 20 of the variable gain amplifier circuit 101 of FIG. 1.

In FIG. 6, the limit circuit 30 limits the voltage difference ΔV between the control voltage Vgcp and the control voltage Vgcn to be greater than or equal to the limit value VL so that the difference voltage ΔE between the output node OUTP and the output node OUTN does not become lower than the setting voltage Vs. Therefore, as in the first embodiment, the phase of the differential output voltage signals voutp and voutn can be prevented from being inverted by 180 degrees with respect to the phase of the differential input current signals iinp and iinn.

What is claimed is:

1. A variable gain amplifier circuit comprising:

a main circuit including a differential current circuit, a current divider circuit connected to a high potential side of the differential current circuit, and a load circuit connected to a high potential side of the current divider circuit, the main circuit being configured to generate differential output voltage signals by the load circuit in accordance with either differential input voltage signals or first differential current signals input to the differential current circuit; and a gain adjustment circuit configured to adjust a gain of the main circuit;

wherein the differential current circuit generates second differential current signals in accordance with either the differential input voltage signals or the first differential current signals, wherein the current divider circuit generates non-inverted divided signals and inverted divided signals from the second differential current signals in accordance with a voltage difference between a first control voltage and a second control voltage, the non-inverted divided signals having a same phase as the second differential current signals, and the inverted divided signals having an opposite phase that is opposite to the second differential current signals, and generates third differential current signals by respectively adding the non-inverted divided signals and the inverted divided signals, wherein the load circuit converts the third differential current signals into the differential output voltage signals, and wherein the gain adjustment circuit includes a generation circuit configured to generate the first control voltage and the second control voltage in accordance with a setting signal, and a limit circuit configured to limit, by detecting an amplitude of the differential output voltage signals, the voltage difference to a limit value or greater so that the amplitude does not become lower than a setting voltage.

2. The variable gain amplifier circuit as claimed in claim 1, wherein the limit circuit maintains the voltage difference at the limit value when the amplitude becomes equal to the setting voltage.

3. The variable gain amplifier circuit as claimed in claim 2, wherein the limit circuit includes a first field-effect transistor (FET) and a second FET, and turns on the first FET and the second FET when the amplitude becomes lower than the setting voltage, a drain of the first FET being connected to a first signal line for transmitting the first control voltage, a source of the first FET being connected to a power supply line, a drain of the second FET being connected to a second signal line for transmitting the second control voltage, and a source of the second FET being connected to a ground.

4. The variable gain amplifier circuit as claimed in claim 3, wherein the limit circuit includes:

a detection circuit configured to output a monitor signal in accordance with the amplitude; and an operational amplifier configured to turn on the first FET and the second FET when a voltage value of the monitor signal becomes less than or equal to a setting value corresponding to the setting voltage.

5. The variable gain amplifier circuit as claimed in claim 1, wherein the differential current circuit includes a differential pair including a pair of transistors, and a constant current circuit connected between the differential pair and a ground line and configured to supply a constant current to the differential pair, wherein the differential pair generates the second differential current signals in accordance with the differential input voltage signals, and wherein a sum of a positive-phase component and a negative-phase component of the second differential current signals is equal to a magnitude of the constant current.

6. The variable gain amplifier circuit as claimed in claim 1, wherein the differential current circuit includes a first constant current source configured to supply a first constant current and a second constant current source configured to supply a second constant current, wherein a positive-phase component of the second differential current signals is generated by subtracting a negative-phase component of the first differential current signals from the first constant current, wherein a negative-phase component of the second differential current signals is generated by subtracting a positive-phase component of the first differential current signals from the second constant current, and wherein the second constant current has a current value equal to a current value of the first constant current.

7. A variable gain amplifier circuit comprising:

a differential current circuit configured to generate second differential current signals in accordance with either differential input voltage signals or first differential current signals;

a current divider circuit configured to generate non-inverted divided signals and inverted divided signals from the second differential current signals in accordance with a voltage difference between a first control voltage and a second control voltage, the non-inverted divided signals having a same phase as the second differential current signals, and the inverted divided signals having an opposite phase that is opposite to the second differential current signals, and generate third differential current signals by respectively adding the non-inverted divided signals and the inverted divided signals;

a load circuit configured to convert the third differential current signals into differential output voltage signals;

a generation circuit configured to generate the first control voltage and the second control voltage in accordance with a setting signal; and a limit circuit configured to limit, by detecting an amplitude of the differential output voltage signal, the voltage difference to a limit value or greater so that the amplitude does not become lower than a setting voltage.

* * * * *